United States Patent [19]

Horvath et al.

[11] Patent Number: 5,052,481

[45] Date of Patent: Oct. 1, 1991

[54] HIGH CONDUCTION COOLING MODULE HAVING INTERNAL FINS AND COMPLIANT INTERFACES FOR VLSI CHIP TECHNOLOGY

[75] Inventors: Joseph L. Horvath, Poughkeepsie; Robert G. Biskeborn, Pawling; Joseph M. Harvilchuck, Billings, all of N.Y.

[73] Assignee: International Business Machines Corporation, Armonk, N.Y.

[21] Appl. No.: 198,962

[22] Filed: May 26, 1988

[51] Int. Cl.⁵ .............................................. F28F 7/00
[52] U.S. Cl. .................................. 165/185; 165/80.2; 357/81; 361/386
[58] Field of Search ............................ 165/80.2, 185; 174/16.3; 357/81; 361/386, 388, 389

[56] References Cited

U.S. PATENT DOCUMENTS

| | | | |
|---|---|---|---|
| 3,993,123 | 11/1976 | Chu et al. ................................ | 165/80 |
| 4,498,530 | 2/1985 | Lipschutz ............................ | 165/185 |
| 4,770,242 | 9/1988 | Daikoku et al. ...................... | 165/185 |
| 4,800,956 | 1/1989 | Hamburgen .......................... | 165/185 |
| 4,879,891 | 11/1989 | Hinshaw .............................. | 72/254 |
| 4,884,331 | 12/1989 | Hinshaw .............................. | 29/558 |

FOREIGN PATENT DOCUMENTS

| | | |
|---|---|---|
| 57-178885 | 6/1982 | Japan . |
| 61-67248 | 4/1985 | Japan . |
| 60-126851 | 7/1985 | Japan . |
| 60-126852 | 7/1985 | Japan . |
| 60-126853 | 7/1985 | Japan . |

OTHER PUBLICATIONS

M. S. Mansuria et al., "Conduction Cooling Structure for a Semiconductor Package," IBM Technical Disclosure Bulletin, vol. 23, May 1981, pp. 5403-5404.
M. S. Mansuria et al., "Chip-Cooling Structure," vol. 25, No. 8, Jan. 1983, IBM Technical Disclosure Bulletin, p. 4452.
IBM TDB; Vol. 19, No. 12, May 1977, "Thermal Conduction Stud" E. L. Dombroski et al., pp. 4683-4685.
IBM TDB, vol. 26, No. 9, Feb. 1984, "High Performance Chip-Cooling Technique for Cold Plate or External Air-Cooled Modules" J. K. Hassan et al., pp. 4658-4660.
K. C. Norris & A. H. Landzberg, "Reliability of Controlled Collapse Interconnections" IBM Journal of Research and Development, vol. 13, No. 3, pp. 266-271.

Primary Examiner—Martin P. Schwadron
Assistant Examiner—Allen J. Flanigan
Attorney, Agent, or Firm—Steven J. Meyers; Aziz M. Ahsan

[57] ABSTRACT

The present invention dissipates the heat generated by high powered VLSI chips to a heat sink in a very efficient manner, providing a thermal resistance heretofore not possible in heat conduction module cold plate type systems. A finned internal thermal device having a flat bottom contacts the chips, while corresponding fins in a finned cooling hat mounted to a cold plate form gaps into which the fins of the finned internal thermal devices are slidably mounted. A preferred double cantilever spring between the finned internal thermal devices and fins of the finned cooling hat and a compliant thermally conductive interface such as synthetic oil between the chips and flat base of the finned internal devices provide efficient, non-rigid interfaces throughout the system, while assuring good thermal contact between the system components. The present high conduction cooling module allows for the simple incorporation of side biasing means and a grooved chip interface on the finned internal thermal devices to provide enhanced thermal performance if required.

45 Claims, 6 Drawing Sheets

HIGH CONDUCTION COOLING MODULE HAVING INTERNAL FINS AND COMPLIANT INTERFACES FOR VLSI CHIP TECHNOLOGY

FIELD OF THE INVENTION

This invention relates to conduction cooling of small, flat heat generating devices such as integrated circuit (IC) chips, and more particularly, to a cooling device having a very low thermal resistance path between the heat generating devices and heat sink.

As used herein, thermal resistance R is defined as $R = dT/Q$, where dT is the temperature difference and Q is the heat flow between the ends of the region. This relationship is a restatement of Fourier's conduction equation $Q = kAdt/L$), with $R = L/kA$, where L is the length of the region, k is the thermal conductivity of the medium and A is the cross-sectional area of the region.

DESCRIPTION OF THE PRIOR ART

The introduction of large scale integration (LSI) and very large scale integration (VLSI) at the chip level and very large scale integration at the module level by packaging multiple chips on a single multilayer substrate has significantly increased both circuit and power densities. For example, integration at the chip and module levels has resulted in circuit densities as high as $2.5 \times 10^7$ circuits per cubic meter with the necessity of removing heat flux densities on the order of 1000 kw/sq meter at the chip level. To remove these high heat flux densities various means of dissipating the heat have been investigated. A restriction is that the cooling fluid (e.g., water) cannot come into direct contact with the chips or the area wherein the chips are mounted. Thus, a cooling hat must be incorporated between the chips and fluid which may be contained in a detachable cold plate. Because the surfaces of the chips on a multichip module are not all coplanar due to substrate camber and chip and solder ball thickness variations, a single flat cooling plate placed in close proximity to the chips would not contact each chip evenly, if at all, thus leaving gaps which increase the thermal resistance to an unacceptable degree for state of the art VLSI applications. Filling the gaps with any of the known compliant thermally conductive materials would lower the thermal resistances, but not enough to achieve 60-120 watts per square cm. Providing a solid, noncomplaint heat flow path from each chip to the flat cooling plate would be thermally acceptable; however, such a rigid system would lead to solder ball fatigue, a well know phenomenon (e.g., see "Reliability of Controlled Collapse Interconnections" by K. C. Norris and A. H. Landzberg in the *IBM Journal of Research and Development*, Vol. 13 No. 3, pages 266-271, May 1979 and so is not mechanically acceptable. What is needed is a compliant thermal connection between the chips and the cooling hat. Furthermore, this connection must provide increased heat transfer surface area for VLSI applications and at the same time be capable of accommodating chip height and tilt variations. A well known method of achieving this is to have an internal thermal device contact the chip and conduct heat to the hat through a thermal interface. An example of a structure using such a cooling hat is the gas encapsulated thermal conduction module (TCM) disclosed in U.S. Pat. No. 3,993,123, issued to Chu et al.

Figure 1:
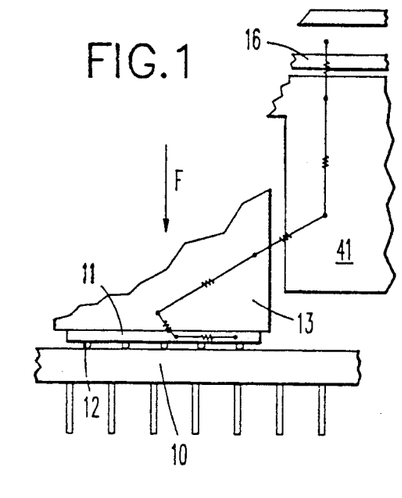
FIG. 1 is a fragmentary illustration in cross-section of a part of the conventional heat conduction module showing the various thermal resistances in the thermal path between the chip and heat sink.

For discussing the thermal performance of a typical thermally enhanced module having an internal thermal device between the chips and cooling hat, reference is made to FIG. 1. The figure is a schematical cross-sectional representation of a single-chip unit of a thermally enhanced module having a cooling hat with separate cold plate, and the thermal resistance of the heat path from the chip 11 to the cold plate 16 divided into various segments. Rext designates the external thermal resistance and is defined relative to the module as $$Rext = dT(h-iw)/Pm$$

where $dT(h-iw)$ is the temperature difference between the hat 41 and the inlet water through cold plate 16 and Pm is the module power. Rext is divided into two parts: the interfacial resistance between the cooling hat 41 and the mating surfaces of the cold plate 16 and the resistance between the cold plate surface and the circulating water inside the cold plate. When the cooling hat and cold plate are not two separate parts joined together but are instead a single entity, then the interfacial resistance is zero. Rint designates the internal thermal resistance, and is defined as $$Rint = dT(c-h)/Pc$$

where $dT(c-h)$ is the temperature difference between the chip 11 and the top of the hat 41 and Pc is the chip power. Rint can be defined as the sum of five component resistances: Rc, Rc-i, Ri, Ri-h and Rh. Rc designates the chip resistance, Rc-i is the thermal resistance of the interface between the chip 11 and the internal thermal device 13, Ri is the thermal resistance of the internal thermal device 13, Ri-h is the thermal resistance between the internal thermal device 13 and the cooling hat 41 and Rh designates the thermal resistance of the cooling hat 41.

The thermal resistance of the interface between the chip 11 and the internal thermal device 13, Rc-i, is a complex function of geometric, physical and thermal characteristics of the contacting solids and the interfacial medium. Rc-i is composed of two parallel thermal resistances: conduction resistance through one or more solid (e.g., metallic) contact areas, and conduction resistance through the interfacial (e.g., fluid) medium used to fill the voids which may exist between chip 11 and internal thermal device 13. The dominant thermal conduction path is usually through the interfacial medium.

The thermal resistance Ri-h between the internal thermal device 13 and the cooling hat 41 is a function of several parameters including the area and thickness of the gap between the internal thermal device 13 and the cooling hat 41, the cross-sectional areas of the internal thermal device 13 and cooling hat 41, and the thermal conductivities of the internal thermal device 13 and cooling hat 41.

As VLSI chips increase in circuit density, switching speed, and corresponding power (e.g. power densities in state of the art high-powered bipolar chips are presently in the 60-120 watt per square cm range), the thermal resistance of heat conduction systems, wherein an internal thermal device is placed between the chips and cooling hat, must be further reduced. In the TCM of U.S. Pat. No. 3,993,123 the internal thermal device 13 is a piston which contacts the chip at one point. The TCM is very useful and successful in VLSI systems of the present but is not easily extendable to future high powered systems in all applications.

In the present state of the art there are many structures for achieving enhanced heat transfer. Among these are intermeshed fin structures wherein the internal thermal device has fins which mate with corresponding fins in the cooling hat. These structures have the potential to provide improved thermal performance over single-surface structures such as the piston in the TCM because they comprise means for increasing the heat transfer area between the internal thermal device, which contacts the chip, and the cooling hat. In intermeshed fin heat sink applications, it is generally known to make the engagement area between the fins as large as possible. The gaps between mating fins must then be wide enough to facilitate manufacturability and assembly. However, the wide gaps that result from having the largest possible engagement area produce a thermal resistance that is unacceptable for state of the art high powered VLSI chips in the 60-120 Watt per square cm range. Gaps which are wide enough to facilitate manufacturability and assembly may not be wide enough to accommodate chip tilt. This results in increased thermal resistance in the gap between chip and internal thermal device due to chip tilt.

Finned structures which require that the finned internal thermal device be bonded to the chip exist in the art. However, such structures are not suitable for the present application because bonding makes rework difficult and costly. Moreover, if the internal thermal device is bonded to the chip, then some means for strain relieving the connection between this device and the hat must be found. The only methods known degrade thermal performance to an unacceptable level. Thus, what is needed is an invention which incorporates an internal thermal device which is not bonded to the chip and which provides a stress free thermal connection with the hat and so accommodates chip height and tilt variations. These restrictions increase the difficulty of being able to dissipate large amounts of heat from the chips since bonded devices and solid and rigid interconnections are normally better thermal conductors than the required compliant interfaces.

Among the known intermeshed fin structures is the "Thermal Conductive Stud" taught by Dombroski et al in the IBM Technical Disclosure Bulletin, dated May 1977, pages 4683-4685. Dombroski et al teach that the long overlapping length and narrow gaps required between mating fins restrict the tilt range of the finned internal thermal device that contacts the chip surface. They teach that when the chip tilt exceeds the tilt range of the internal thermal device, an unacceptably large gap between said finned device and chip results. In an attempt to overcome this, Dombroski et al teach that the fins of the internal thermal device should not be integral but rather should be independent T-shaped studs, each of which can then move vertically into line contact with the tilted chip. The T-shaped studs are long, which increases their thermal resistance; and there are gaps between T-shaped studs which increase the thermal resistance between the studs and tilted chip. Thus, while the resistance between the fins is relatively low, there is added resistance between the chip and fins. Furthermore, the base of the finned internal thermal device is interrupted and so restricts the spreading of heat from chip to the fins and between the fins. The fact that multiple springs and T-shaped studs are required for each chip makes this system very costly and complex to manufacture in a conduction cooling module environment containing 100 or more chips.

Hassan et al teach intermeshed finned cooling structures in the IBM Technical Disclosure Bulletin article entitled, "High Performance Chip-Cooling Technique for Cold Plate or External Air-Cooled Modules", dated Feb. 1984, pages 4658-4660. Hassan et al particularly disclose a finned internal thermal device having a low melting point solder at the interface of the base portion of the finned internal thermal device and the chip; and a centrally located coil spring plus elastomer material, which is used for shock absorbing purposes, or, alternatively, elastomer material along for both shock absorbing purposes and spring loading combined. The finned internal thermal device is biased towards the chip by the coil spring plus elastomer or elastomer alone, and chip tilt is specifically accommodated by large gaps between the cooling hat fins and the fins of the internal thermal device. Low melting point solders are subject to voids which can increase the thermal resistance to a level unacceptable for future VLSI applications. Furthermore, low melting point solders have not been proven to be physically stable in such interfaces; and a reliability concern is escape of solder from the interfaces and into the module circuitry, where it could cause short circuits. The coil spring severely impacts thermal performance by occupying area that would otherwise be used for heat transfer. The elastomer spring also occupies area critical to achieving high heat conduction, does not provide a significant parallel heat flow path and interferes with side-loading the finned internal thermal device for future applications as will be discussed in the Detailed Description of the present invention.

Oguro et al in Japanese Patent Application No. J57-103337 (1982), entitled, "Heat Transfer and Connection Device and Method of Manufacture Thereof" disclose a pair of intermeshed finned structures, wherein one member of the pair consists of a set of fins attached to a base which is anchored to a chip. Oguro et al teach the use of wide gaps between intermeshed fins to allow assembly of the finned structure which is anchored to the chip. Wide gaps, however, mandate the use of tall fins to reduce the interface resistance between corresponding intermeshed fins. The tall fins contribute to a higher overall thermal resistance than corresponding shorter fins. In addition, the Oguro et al fins are immovable after assembly, and must be thin and capable of flexing so as not to break the chip or its delicate solder connections when the module components heat up and expand at different rates. The resultant structure does not provide a low enough thermal resistance to cool the high powered chips described above in a water cooled heat conduction module type system wherein a cold plate and cooling hat form a thermal conduction path (i.e., the minimum thermal resistance shown in Oguro et al is 10° C./W). In addition, bonding a finned structure to the chip produces mechanical stress, solder ball fatigue, reliability and rework problems as alluded to above, particularly if used in conjunction with high power chips.

Takenaka in Japanese Patent Application No. J61-67248 (1986), entitled "Module Cooling Structure", discloses a pair of intermeshed finned structures wherein one member of the pair is attached to the semiconductor chip. This system is mechanically too rigid for the applications covered by Applicants' invention for the same basic reasons as Oguro et al and would be subject to a multitude of mechanical stress, solder ball fatigue, reliability and rework problems if used in the high power applications, of Applicants' invention.

Nishimura in Japanese Patent Application No. J60-126852 (1985), entitled "Cooling Device for Semiconductor", discloses a pair of intermeshed finned structures wherein one member of the pair is spring loaded against the chip by a centrally located coil spring as in Hassan et al. The coil spring has been found to impair thermal performance by occupying area that would otherwise be used for heat transfer, and interfering with side biasing for higher power applications requiring side biasing as taught by Applicants. Other functional disadvantages of such a spring in an intermeshed finned cooling system, such as non-uniform loading over the surfaces of the chips, will become apparent hereinafter in the Detailed Description. Furthermore, Nishimura teaches that the cap should be thinner in the regions between chip sites than in the region of each chip site. This would impair thermal performance for the applications of the present invention by increasing the thermal resistance from the fins at the sides of each chip site to the cap.

Oguro in Japanese Patent Application No. J60-126853 (1985), entitled, "Cooling Device for Semiconductor Chip", discloses a pair of intermeshed finned structures wherein one member of the pair is spring loaded against the chip by a centrally located coil spring, thus, the thermal performance is impaired for reasons similar to those described above for Hassan et al and Nishimura.

In view of the above requirements and the existing state of the art, it is apparent that there is a need in the art for a high performance heat conduction module that is capable of dissipating 60–120 watts per square cm. chips mounted in a module without requiring cooling fluid in direct contact with the chips or within the area wherein the chips are mounted. There is also a need that there be no rigid connection between the chips and the internal thermal device utilized in the module, and a need that means exist for accommodating chip tilt and chip height variations. The rework of chips must be easily facilitated, and a substantially uniform load must be applied to the chips by the internal thermal device for mechanical integrity advantages as well as thermal function advantages such as making the removal of debris at the interface of the chip and internal thermal device automatic so as to minimize thermal contact resistance. There is a further need to extend the power dissipating capability of the heat conduction module meeting all of these needs by providing means for further lowering the thermal resistance of the internal thermal devices.

SUMMARY OF THE INVENTION

It is an object of the present invention to provide a high performance heat conduction module that is capable of dissipating 60 to 120 watts per square cm. from heat generating devices such as semiconductor chips without requiring cooling fluid in direct contact with the chips or within the area wherein the chips are mounted.

It is a further object that there be no rigid connection between the chips and the finned internal thermal device utilized.

It is still a further object that means exist for accommodating chip tilt and chip height variations.

A further object is that rework of chips be easily facilitated.

A still further object is to provide for the automatic removal of debris at the interface of the chip and internal thermal device.

Another object is that the power dissipating capability be extended as high as possible without adversely affecting the other objects of this invention.

The above objects and other related objects are accomplished by the finned internal thermal device having a flat base with fins thereon and corresponding finned cooling hat wherein a complaint thermal medium exists at the chip to finned internal thermal device interface as well as at the interface of corresponding fins of the internal thermal device and the cooling hat. A unique biasing means provides a balanced force between each finned internal thermal device and finned cooling hat and urges the flat surface of each finned internal thermal device towards its corresponding chip through the compliant thermal medium. The biasing means typically occupy otherwise unused area between the cooling hat and finned internal thermal device, and comprise at least one arm that may or may not be shaped. The unique biasing means is preferably a low-profile spring with two or more cantilever arms preferably attached to cantilever supporting members, which are preferably secured to the base of the finned internal thermal device. Alternative configurations using various spring arms are possible, for example wherein the spring arms are directly attached to the base of the finned internal thermal device and contact corresponding areas of the cooling hat. The spring is preferably made from flat stock and having a cross member and dual cantilever supporting members secured to the base of the finned internal thermal device with the cantilever arms located in the spaces between the fins closest to the outermost sides of the finned internal device. For a two arm cantilever spring, the fixed ends of the two cantilever arms are attached to diagonally opposite sides of the supporting members and the free ends of the cantilever arms contact and push against the corresponding fins in the finned cooling hat. The low profile double cantilever spring provides a balanced load at the interface of the chip and finned internal thermal device which results in uniform pressure and corresponding uniform heat flow through the compliant interface and which provides a force which is sufficiently balanced to minimize the detrimental effect of debris at the chip interface. The low-profile double cantilever spring provides these advantages and at the same time allows the finned internal thermal device to move laterally and parallel to the chip surface though the compliant interface. The low-profile double cantilever spring does not occupy the region used for intermeshed fin heat transfer and so unlike the coil spring does not take away from the thermal conduction path. In fact the arms of the cantilever spring provide a parallel heat conduction path between the finned internal thermal device and the finned cap resulting in a lower thermal resistance than would otherwise be obtained.

It is preferred that the compliant interface be an oil-like film having excellent stability and a relatively good thermal conductivity such as synthetic oil. The compliant film between chip and finned internal thermal device in combination with the unique biasing means arrangement gives a very low thermal resistance interface that accommodates all thermally induced stress in the module package, is immune to effects of contamination in the conductive medium, is insensitive to chip height and tilt variations, and allows the use of rigid intermeshed fins with very fine gaps.

The cooperation of the rigid mating fins having a flat base in contact with the chips, double cantilever spring and compliant interface in the high conduction cooling module allows for an internal thermal conductance of approximately 1.8 W/cm$^2$–°C. between each chip and the top of the cooling hat. The corresponding thermal resistance between a square cm. chip and the top of the cooling hat would be approximately 0.75° C./W.

The combination of elements also facilitates the simple incorporation of other features that unexpectedly have been found to lower the thermal resistance by an even greater amount such as the incorporation of side biasing means such as a springlike member formed by making a cut into an outer fin of one of the finned internal thermal devices. The side biasing means urges the finned internal thermal device into close thermal contact with the corresponding fins of the cooling hat on one side, but increases the gap on the opposite side. Nevertheless, thermal resistance has been found to be decreased by as much as 30%. A further enhancement comes into play if micro-grooves are formed in the flat face of the rigid finned internal thermal device.

BRIEF DESCRIPTION OF THE DRAWINGS

The invention is best understood by reference to the detailed description which follows in conjunction with the accompanying drawings, wherein.

DETAILED DESCRIPTION

Figure 2:
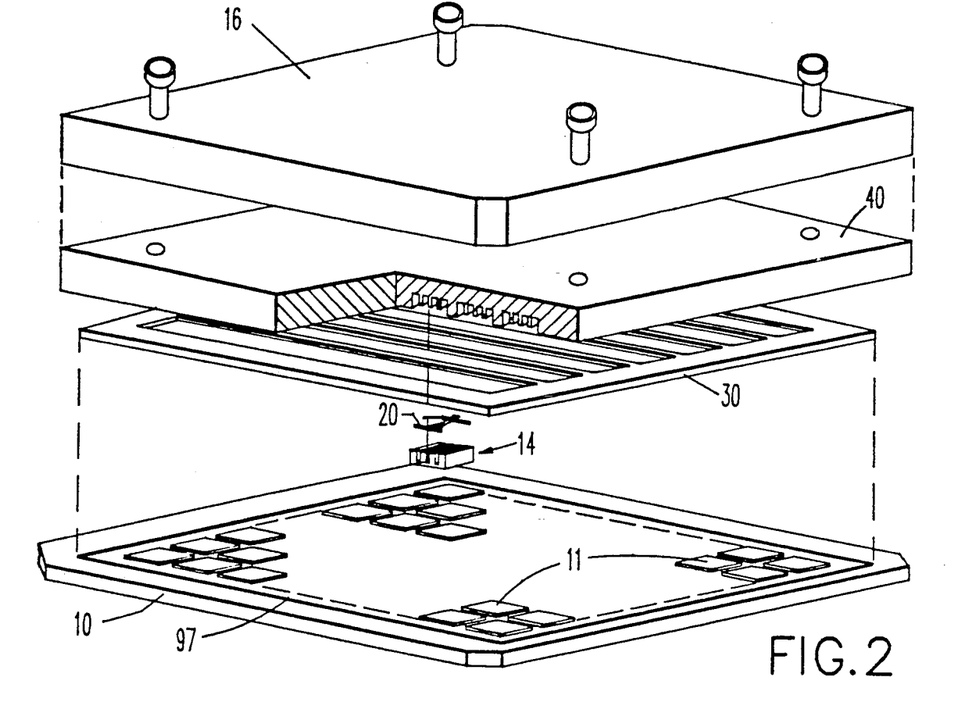
FIG. 2 shows an exploded isometric view of the overall enhanced high conduction cooling module of the present invention.

The overall mechanical assembly of the specific elements of a high conduction cooling module built in accordance with the present invention for removing heat from heat generating devices such as semiconductor chips is illustrated in FIG. 2. In FIG. 2 a chip 11 that must be maintained below a specific temperature is mounted on a substrate 10, having a c. ring seat 97. Preferably the chips are mounted to substrate 10 by solder balls, 12 i.e. See U.S. Pat. No. 3,495,133, in a face down orientation and substrate 10 is a multi-layered substrate. A finned internal thermal device 14 having substantially rigid fins on a rigid base is positioned over each chip and is free to move laterally in a plane parallel to the chip through a compliant thermal interface which is not shown in this view. Cooling hat 40 having rigid fins which intermesh with the rigid fins of the finned internal thermal device 14 is attached to or is an integral part of a cold plate 16. The cooling hat 40 can be fabricated from a single piece of material. Alternatively, the cooling hat 40 may be fabricated as at least two basic parts, namely, fins and a separate supporting frame for the fins. Preferably, the cold plate has a liquid, e.g. water, flowing therethrough. However, alternate means of cooling are available, for example, finned structures with air movement dissipating heat from the module. Preferably, a separator 30 provides for the efficient positioning of finned internal thermal devices 14 over the chips in the multi-layered substrate module. By using the separator 30, continuous channels may be formed in cooling hat 40 which facilitates ease of manufacture and allows for improved tolerances. A biasing means 20 exists between the finned internal thermal devices 14 and the cooling hat 40. The biasing means exerts a uniform biasing force between the contacted areas so that the flat surface of the base of the finned internal thermal device is urged toward the chips through the thermally compliant medium.

Figure 3A:
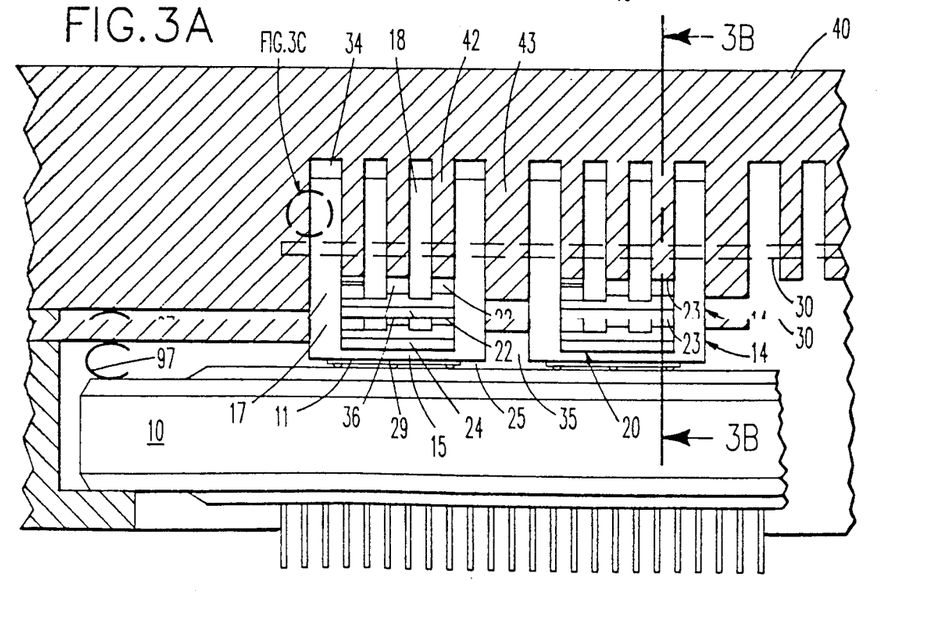
FIG. 3A shows a fragmentary sectional view of a portion of the enhanced high conduction cooling module assembly of the present invention.

The biasing means are typically springs that occupy the otherwise unused space between the cooling hat and the finned internal thermal devices. Referring to FIG. 3A, the unused space typically comprises the channels 34, 36 which are formed between intermeshed fins and partially bound by the fins of the cooling hat or the fins of the finned internal thermal device and the space 35 between the outer surfaces of the finned internal thermal devices 14. The biasing means typically allow the fins of the finned internal thermal device and the cooling hat areas facing forward the chips to come as close together as possible upon compression. To accomplish this, the biasing means is typically a spring comprised of at least one arm. When the spring is fully compressed in a module having channels as described above, the spring does not unduly restrict the amount that the fins of the cooling hat and finned internal thermal device overlap. When the spring arms reside in the channels 34, 36 then the springs are preferably low profile. When the spring arms occupy at least the unused space 35 between finned internal thermal devices, then the arms may be longer so as to extend from the base of the finned internal thermal devices to which they are secured, to the area of the cooling hat facing the chips. The spring itself may be a single arm that is shaped for various applications as shown in FIGS. 4C, 4D and 4E.

For springs which reside partially or completely in channels 34 or 36, it is preferred that the spring design permit compression of the spring to a thickness of approximately one to three times the thickness of a single arm of the spring when exposed to the forces applied by the finned internal thermal device and cooling hat after a module is assembled. These forces are preferably less than approximately 1000 grams/cm$^2$ so as not to damage chip circuitry or solder balls.

The aforementioned spring comprised of at least one arm typically fits into either the channels 34, 36 or the spaces 35 between the outer surfaces of the finned internal thermal devices, or both so that no heat transfer area is eliminated for the sake of accommodating the biasing means, as in the case of those structures in the art using large, single coil springs inserted into bored out areas within the intermeshed fins. When the spring is placed in the space 35 between the outer surfaces of the finned internal thermal devices, it is typically secured to each finned internal thermal device, most commonly, the base of each finned internal thermal device. The spring comprising at least one arm exerts an adequate biasing force to urge the base of the finned internal thermal devices toward the chips, while accomplishing other objects of the present invention, such as not applying excessive forces that may destroy chip circuitry or cause excess fatigue or damage to solder ball 12 connections.

For example, discrete low-profile springs (preferably flat) may be mounted in the channels 34 partially bound by the fins of the cooling hat, and exert a biasing force that urges the finned internal thermal device toward the chip. Typically, this low-profile spring may comprise a material having spring-like properties (e.g., stainless steel wire), which is appropriately bent so as to be located in the channels while remaining in place during the life of the module. Another example of biasing means placement within the above described channels and spaces includes the securing of one end of the biasing means to an outer surface of the finned internal thermal device while the other end pushes off of a surface of the cooling hat that faces the chips. Alternatively, one end of the biasing means may be attached to a surface of the cooling hat, and the other end pushes against a surface of the finned internal thermal device facing the cooling hat. Given the teachings above, various springs can be placed at least partially in the aforementioned channels 34, 36 and spaces 35 between finned internal thermal devices, depending on the application. In those applications wherein the springs occupy at least the spaces 35 between finned internal thermal devices, the spring is usually attached to the finned internal device.

It is preferred that one end of the biasing means partially occupies the space between the bases of the finned internal thermal devices and is secured to the base, while another end occupies the channel 36 partially bound by the fins of the finned internal thermal device and pushes against the surfaces of the cooling hat facing the chips.

Preferably, the biasing means is a cantilever spring wherein the free end of the cantilever arms of the cantilever spring contact the bottommost surfaces of the fins 42, 43 of cooling hat 40 while the fixed cantilever end is preferably attached to the base of the finned internal thermal device, and at least two cantilever arms are placed in the channels 36 between the fins of the finned internal thermal device. Alternate cantilever springs are operable within the confines of the present invention. These springs may have only a single cantilever arm, or up to as many cantilever arms as there are fins on the finned internal thermal devices 14, or cooling hat 40. The cantilever arms occupy either the aforementioned channels 34, 36, spaces 35 between finned internal thermal devices or both. The preferred cantilever spring is discussed throughout the remainder of the specification, even though various biasing means as described or anticipated above are suitable in the present invention.

The cooperation of the basic elements of the present invention and the critical thermal interfaces of the high conduction cooling module are now described in greater detail with reference to FIG. 3A. The finned internal thermal devices 14 are mounted over the chips 11 and are free to move in a plane parallel to the top surface of the chips through a compliant thermal medium 29. Each finned internal thermal device 14 has a flat base 15. Preferably, the surface 25 of rigid base 15 adjacent to the surface of chips 11 is an ultra-flat surface, i.e. less than 1 micron deviation per centimeter. It is preferred that the outermost rigid fins 17 of the finned internal thermal device 14 be wider than the interior fins 18 as thermal performance has been found to improve under such conditions. Depending upon the application, all fins of the finned internal thermal device may be of the same size if maximum cooling potential is not required.

It is preferred that the rigid bases of the finned internal thermal devices overhang each side of chips 11. The optimum amount of overhang has been found to be approximately one base thickness on each side of chip 11. The finned internal thermal devices 14 can be made from any material which is rigid and has a good thermal conductivity. Primary examples are aluminum, copper, berillya, alumina, silver, silicon carbide and combinations or alloys thereof. However, it is also preferred that the material be soft enough that debris and microscopic particulate matter which may find its way to the chip to rigid fin base interface are forced by the cantilever spring into the base of the finned internal thermal device. The thermal contact resistance at the chip to finned internal thermal device interface can increase to unacceptable levels if such debris is not compressed or embedded. The fins 42, 43 of cooling hat 40 are intermeshed with the fins 17, 18 of the finned internal thermal devices 14. Cooling hat 40 and its associated fins 42, 43 are rigid and are also typically made of a heat conductive material such as aluminum, copper, berillya, alumina, silver, silicon carbide or combinations or alloys thereof. It is preferred that the distance between corresponding rigid fins 42, 43 be such that a rigid fin 17, 18 of the finned internal thermal device 14 can fit therein and a gap remain which is the minimum gap acceptable for the finned internal thermal device to accommodate chip tilt. In order to accommodate differences in chip height, it is preferred that the height of the channels 34 between fins 42, 43 is such that there is a vertical gap between the surfaces of the rigid fins 18 of the finned internal thermal devices facing the cooling hat and the bulk of cooling hat 40. To minimize the thermal resistance it is preferred that the rigid fins 43 of finned cooling hat 40 be made larger and longer than the rigid fins 42. Rigid fins 43 are those fins which overlap the outermost surface of the outermost fins 17 of the finned internal thermal devices 14. For both the finned cooling hat 40 and the finned internal thermal devices 14, the ratio of the length of each rigid fin to the width of each rigid fin should not be greater than approximately 10:1 to provide a low profile thermal conduction path and corresponding low thermal resistance. A practical upper bound on the ratio of the length of each rigid fin to the width of each rigid fin has been found to be less than approximately 7:1, based on a balance of state of the art machining practice and cost of fabrication. The ratio of the length of each rigid fin to the width of each rigid fin should not be less than approximately 3:1 when the fins are made from the commonly available thermally conductive materials such as copper and aluminum as a smaller ratio would severely limit the thermal performance of this invention. If maximized cooling in an environment where the cooling fluid cannot be brought into direct contact with the chip compartment is not critical or if a particular application imposes other restrictions, then the geometries of fins described above can vary. For example, the aspect ratio for cooling hat fins may be different than the aspect ratio of the finned internal thermal devices depending on material properties.

The gaps between adjacent rigid fins of the finned cooling hat 40 and finned internal thermal device 14 are preferably filled with a compliant thermal medium 29. In some instances, the compliant thermal medium 29 will be the same thermal medium used between chips 11 and the base 15 of the finned internal thermal device, e.g. synthetic oil. The primary compliant thermal media utilized are heat conductive oils of low viscosity, i.e., in the range of approximately 350–1800 centipoise, e.g., synthetic mineral oils such as poly(alfaolefin). Other applicable compliant thermal media include thermal pastes and gels which are basically comprised of liquid or gel-like carriers filled with thermal filler particles, or thermally conducting gasses such as helium which may be used in certain applications.

While the thermal conductivities of synthetic oils are approximately 8 times less than that of thermal pastes or gels, synthetic oils are fully compliant and permit the incorporation of finer gaps. In addition, the use of synthetic oil in the gaps between intermeshed fins readily accommodates side-biasing of the finned internal thermal device, and this results in even lower thermal resistances. In an all oil system, if chip tilt is to be accommodated, the gaps cannot be arbitrarily small, but rather must be equal to or greater than the product of the corresponding chip tilt angle times the overlapping length between adjacent fins. In the present invention, there is an unexpected deviation from the usual linear thermal resistance versus gap relationship in the direction of improved thermal performance as will be described in greater detail hereinafter. The use of thermal pastes or gels generally requires larger gaps due to the reduced compliance of the paste or gel. Furthermore, the finite size of the particles in the paste or gel limits how close to one another the intermeshed fin surfaces can come. Overall, however, thermal pastes or gel with high thermal conductivity can be used to enhance the performance of finned high conduction cooling modules as disclosed herein.

In order to provide a low profile finned internal thermal device in a system capable of cooling less than approximately 0.75° C. per watt per square centimeter of chip area while accommodating height and chip tilt variations in a high conduction cooling module, the interface between the ultra flat surface of the finned internal thermal device and chip face is very critical. The unique incorporation of the biasing means of the present invention assures the integrity of this interface so that the finned internal thermal device 14 freely moves over the face of chip 11 while maintaining a very low thermal resistance at the interface, and not causing excessive stresses that may damage chips or solder connections of chips to substrates.

Figure 3B:
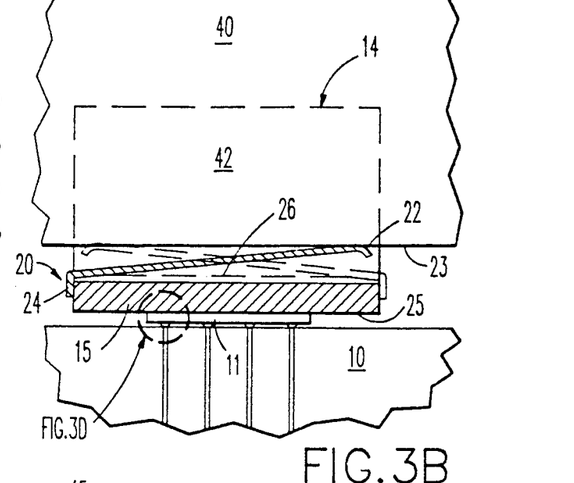
FIG. 3B shows a fragmentary sectional view of a portion of the enhanced high conduction cooling module assembly highlighting the cooperation of the cantilever biasing means and fin structures.
Figure 3C:
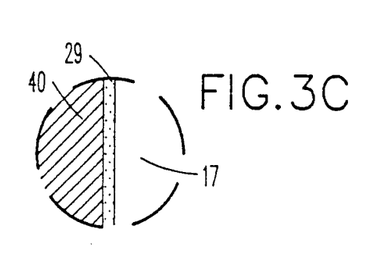
FIG. 3C an enlarged section from FIG. 3A.
Figure 3D:
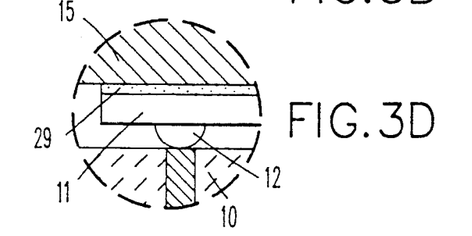
FIG. 3D shows an enlarged section from FIG. 3B.
Figure 4A:
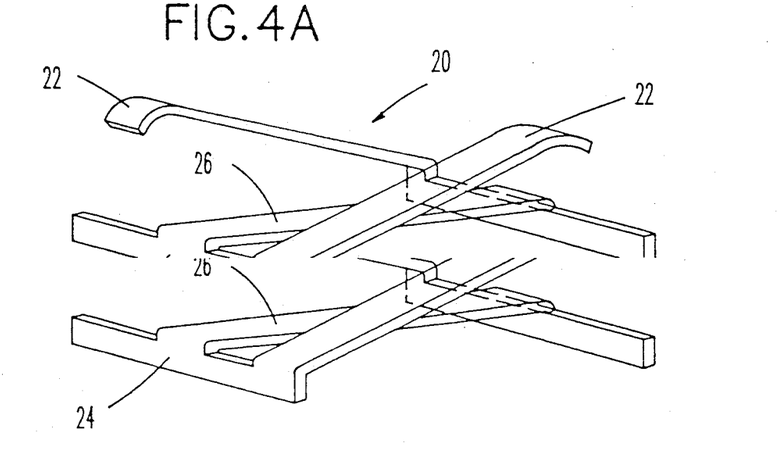
FIG. 4A shows an isometric view of a cantilever spring of the present invention.
Figures 4B, 4C:
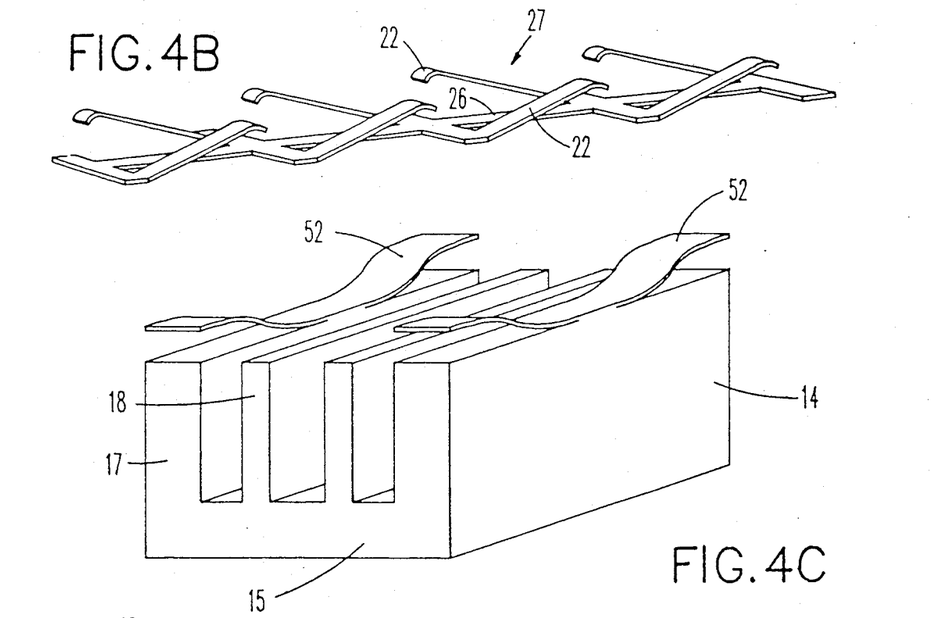
FIG. 4B shows an isometric view of an interconnected multiple cantilever spring.
FIG. 4C shows an alternative finned internal thermal device/spring assembly.
Figure 4D:
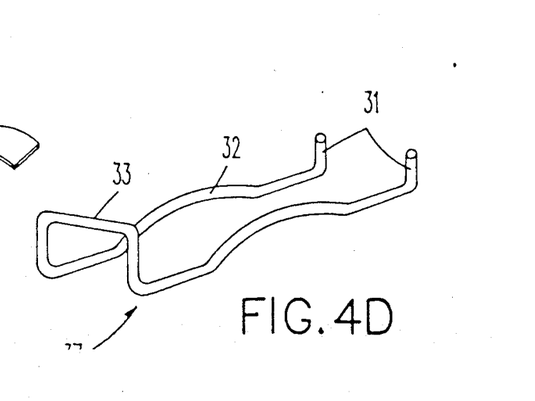
FIG. 4D shows an alternative spring.
Figure 4E:
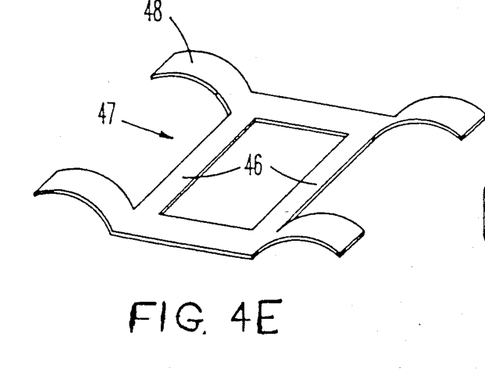
FIG. 4E shows yet another alternative spring.

Referring to FIG. 4A, the preferred biasing means being a low profile spring 20 having at least two cantilever arms 22 is shown. The spring as installed is shown in FIG. 3B, wherein the fixed ends of cantilever arms 22 are connected to supporting members 24 which are secured to the base 15 of the finned internal thermal device 14 and attached to each other by cross member 26. The free end of each cantilever arm 22 preferably contacts the bottommost surface 23 of a rigid fin 42 of said finned cooling hat 40. This most preferred configuration is referred to throughout the specification even though other embodiments or configurations of the spring may exist, for example, wherein the fixed ends of the cantilever spring are secured to the cooling hat and wherein the free ends of the cantilever arms 22 contact the uppermost surface of a corresponding rigid fin 18, 17 of the finned internal thermal device (not shown). Other configurations using spring arms are also possible, for example, wherein the spring arms are directly attached to the base 15 of the finned internal thermal device 14; or wherein a single cantilever arm or multiple cantilever arms are used. The cantilever spring 14 is preferably made from flat stock having a central cross member 26 and dual cantilever supporting members 24 which are secured to base 15 of the finned internal thermal device 14. The angle between the cantilever arms of the cantilever spring and the base to which it is preferably secured is in the range of approximately 15° to 60°, and preferably approximately 30°. The spring also preferably contains a thermal conductor material such as copper, aluminum, silver or alloys thereof in combination with a common spring material, e.g., zirconium-copper. In such a system, the free ends of the cantilever arms 22 contact the bottommost surface 23 of fins 42 of cooling hat 40. The cantilever biasing means positioned as shown in combination with the fin structures and compliant media in the desired gaps of the present invention results in a low thermal resistance previously not attainable in thermal conduction module type systems wherein the cooling fluid cannot come into contact with the chip compartment. The preferred low profile double cantilever spring provides a balanced load at the interface of the chip and finned internal thermal device which results in uniform pressure and corresponding uniform heat flow through the compliant interface (e.g. synthetic oil) and provides a force which is sufficient and balanced enough to minimize the detrimental effects of any debris at the chip interface. The low profile double cantilever spring contributes to these advantages as well as contributing to the chip tilt and height variation accommodation as the ultra-flat surface of the finned internal thermal device freely moves laterally and parallel to the chip surface through the compliant interface. The low profile double cantilever spring also does not take away from the thermal conduction path area since it does not occupy space that may otherwise be allotted for finned internal thermal device area or for the finned area in the cooling hat, and at the same time provides a parallel heat flow path between the finned internal thermal device 14 and the cooling hat and associated fins. Biasing means having either one or more than two cantilever portions may also be used in high conduction cooling module systems made in accordance with the present invention. The exact number of cantilever portions used depends on the size of the chip and corresponding number of fins utilized.

As shown in FIG. 4B, a plurality of low profile cantilever springs may be interconnected and inserted into the module as a single unit 27 to facilitate ease of assembly and to provide locating means for the finned internal thermal devices.

Referring to FIG. 4C, double cantilever springs 52 may be attached to the uppermost fins of the finned internal thermal device 14 and function as described above.

Referring to FIG. 4D, a spring 37 comprised of at least one serpentine arm 32, preferably being bowed approximately at the center may be suitably placed in the channels. In the preferred embodiment shown in FIG. 4D, two serpentine arms 32 bowed at their centers are joined to fastening clip 33 which secures the spring 37 to the base of a finned internal thermal device. In this preferred embodiment, securing means 31 are also incorporated. Variations of the serpentine arm spring are possible within the spirit of the present invention; for example, wherein the spring 37 is secured to the cooling hat, and the bowed portions of the serpentine arm 32 contact portions of the finned internal thermal devices. A plurality of the springs 37 having serpentine arms 32 may be interconnected.

Referring to FIG. 4E, yet another spring 47 is shown. In this embodiment, flat spring members 46 reside in the channels between finned internal thermal device fins, and contact the base of the finned internal thermal device, while spring wings 48 contact portions of the cooling hat. As in the case of most alternative embodiments of the present invention, this spring may be reversed so that flat spring members 46 reside in the channels between cooling hat fins, while the spring wings 48 contact portions of the finned internal thermal devices.

It is generally known that the thermal performance of an intermeshed fin structure is dependent upon the gap between corresponding fins, and that thermal performance varies linearly with the change in gap. In the present invention, an unexpected improvement over the normally linear relationship between gap width and thermal performance has been found. This unexpected improvement occurs for gaps below approximately 0.1 mm wide in the present invention. Making the gaps no larger than that required for chip tilt accommodation results in the aforementioned unexpected enhancement in thermal performance. Thus, it is not possible to achieve the required level of thermal performance simply by increasing the intermeshed fin surface area. For very fine gaps, enhanced performance is possible only for fins having an aspect ratio greater than approximately 3 to 1, but less than approximately 10 to 1. State of the art machining practice sets this ratio at approximately 6.5 to 1. With this ratio and with gaps having the required degree of chip tilt accommodation, the optimum fin thickness is approximately 0.8 mm. Such fins are mechanically rigid and can be used only with compliant chip interfaces. Many previous intermeshed fin cooling structures accommodate chip tilt in only one direction (parallel to the fins), and thus could not be used for high performance applications which require negligible chip interface resistance under all chip tilt conditions. The present invention accommodates chip tilt in the direction parallel to the fins and also in the direction perpendicular to the fins. The prior intermeshed fin cooling structures do not provide a compliant chip interface in combination with a cantilever spring and rigid intermeshed fins, or a thermal resistance low enough for the high powered VLSI applications addressed by the present invention. This is possible because of the subtle but critical interplay between the gap and intermeshed fin characteristics described above.

Figure 5A:
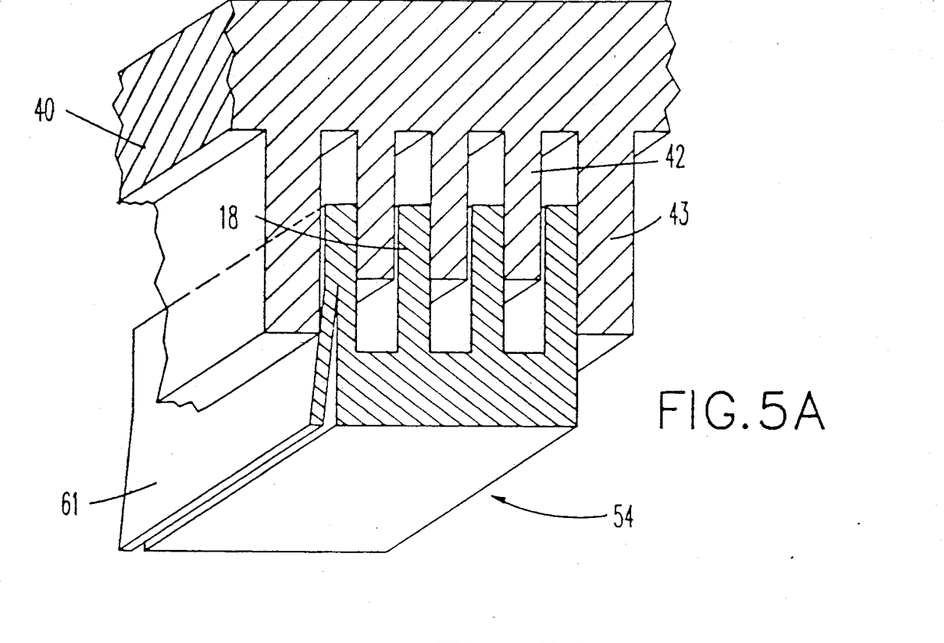
FIG. 5A shows a front elevational view of a portion of the enhanced high conduction cooling module further incorporating side biasing means.
Figure 5B:
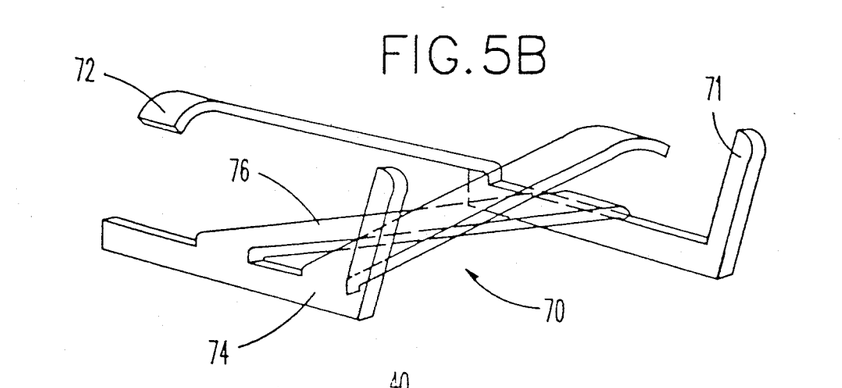
FIG. 5B shows a view of an alternative side biasing means in combination with the cantilever spring.
Figure 5C:
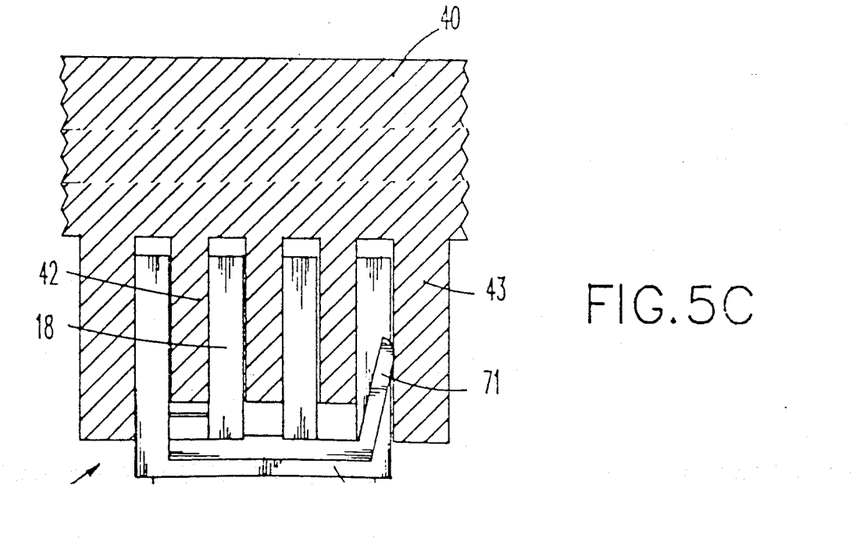
FIG. 5C shows a fragmentary sectional view of a portion of the enhanced high conduction cooling module further incorporating an alternative side biasing means.

In addition to providing the advantages of low thermal resistance and the other advantages alluded to above, the combination of elements of the high conduction cooling module of the present invention allows for the incorporation of additional features which have unexpectedly been found to lower the thermal resistance by even a greater amount than that shown in the preferred embodiments. Due to the freely moving yet thermally efficient interfaces of the present invention, side biasing means may be incorporated between each finned internal thermal device 14 and corresponding portions of the finned cooling hat 40. The preferred side biasing means is depicted in FIG. 5A wherein a modified finned internal thermal device 54 is formed by a spring flap 61 being cut from the outermost surface of the outermost fin on the side opposite the direction of the desired biasing. The detailed dimensions of the spring flap 61 in relation to the remainder of the finned internal thermal device are described in the working example section to follow, along with the corresponding improvement in thermal resistance over the first embodiment. When using the side biasing means, the resultant gap between corresponding fins of the finned internal thermal device and finned cooling hat is filled with a thermally conductive compliant medium. As shown in FIGS. 5B and 5C a modified cantilever spring 70 having cantilever arms 72 on cantilever supporting members 74 on either side of cross member 76 also incorporates side biasing appendages 71 therein. Side biasing appendages 71 are typically formed from the same flat metal stock as the spring 70, and are preferably approximately one half of the height of the fins 18 or less. As shown in FIG. 5C, when the modified cantilever spring 70 is loaded into the module, the angle between side biasing appendages 71 and the cantilever supporting member 74 is greater than 90°, preferably between 100° and 110°.

In certain applications, a single spring 20 as shown in FIG. 4A may be used for both biasing the finned internal thermal device toward the chips and for side biasing. A means for accomplishing this with a single spring 20 is by inclining the surfaces of the fins 17, 18 of the finned internal thermal devices 14 that face the cooling hat, and by having corresponding inclined surfaces in the cooling hat 40.

Figure 5D:
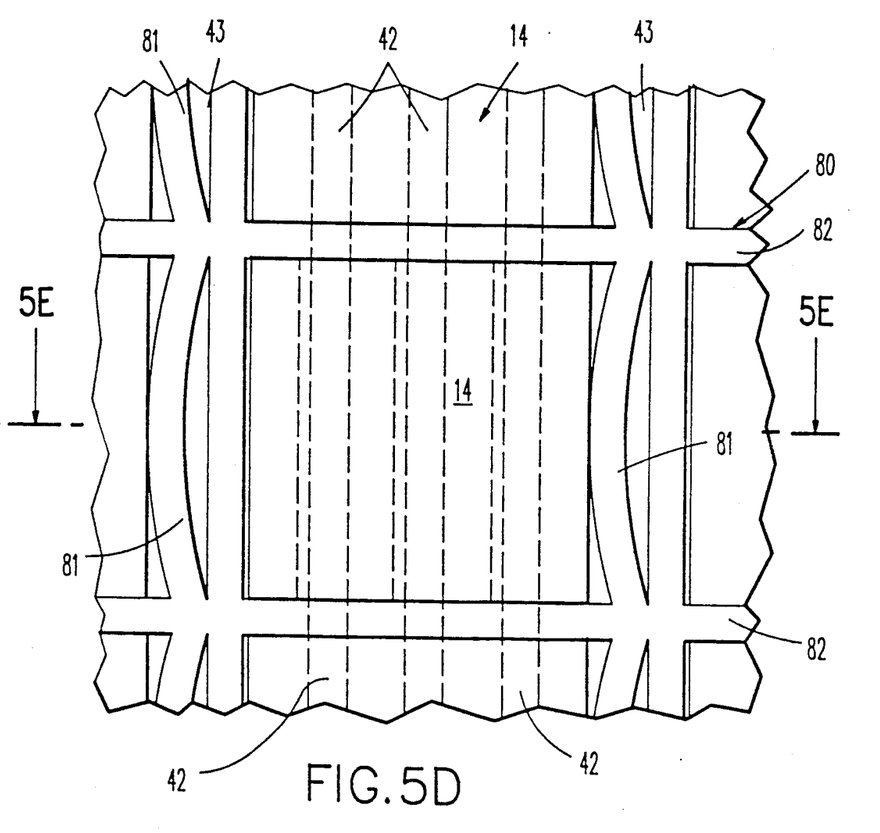
FIG. 5D shows a top view of an alternative embodiment of yet another side biasing means.
Figure 5E:
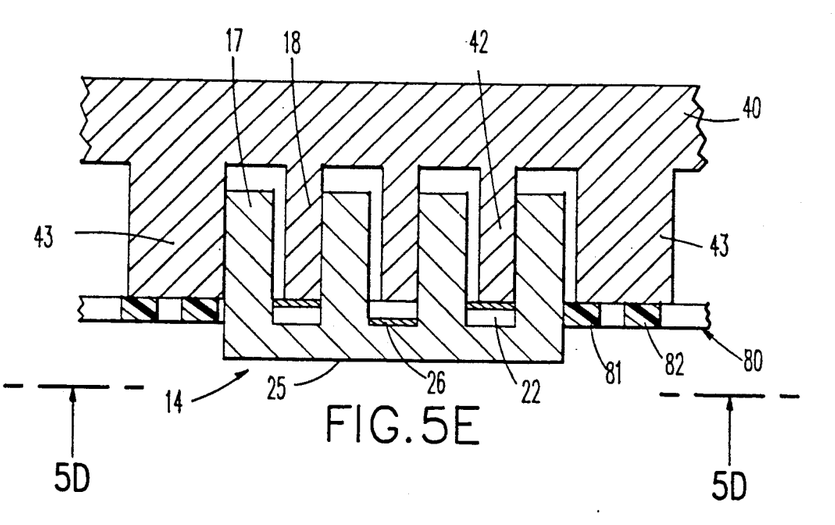
FIG. 5E shows a cross section of the biasing means shown in FIG. 5D.

Another alternate side biasing means is shown in FIGS. 5D and 5E. In FIG. 5D, a resilient sheet 80, having flexible bowed portions 81 and interconnecting portions 82 is shown. Flexible bowed portions 81 side bias the finned internal thermal devices 14. The resilient sheet is preferably between approximately 0.05 to 0.2 mm. thick, and is mounted close to the base of the finned internal thermal device 14. The resilient sheet serves a dual purpose, as it also provides a means for locating and separating the finned internal thermal devices 14. FIG. 5E is a representation of the use of resilient sheet 80 in a cross-sectional front elevational view. The bowed portions 81 preferably contact and urge the finned internal thermal device 14 at the lower extremities thereof, e.g., towards the bottom of fin 17 in this instance.

Figure 6:
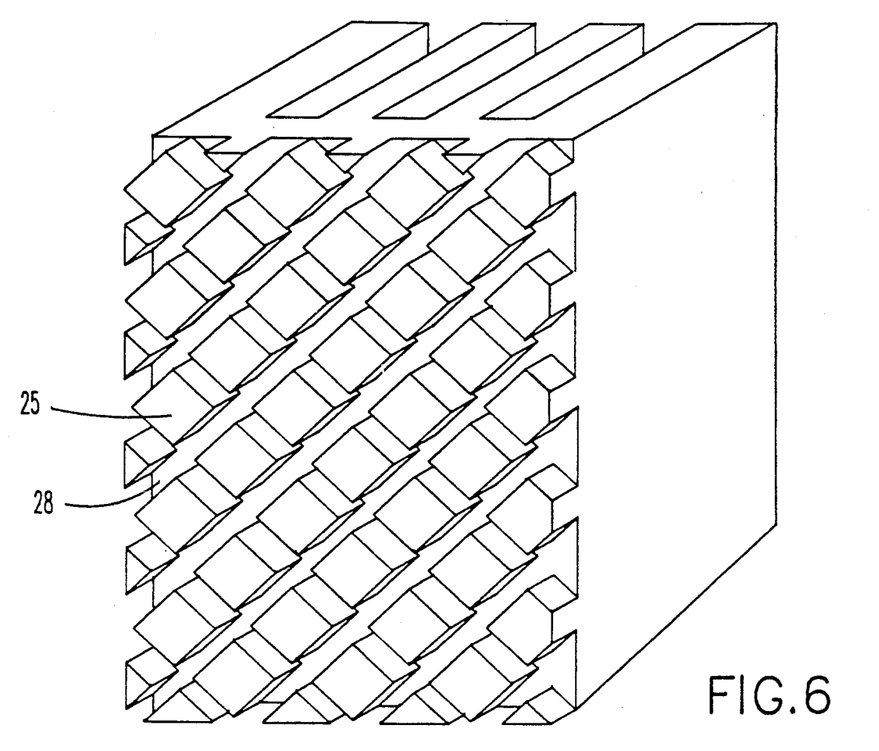
FIG. 6 shows an isometric view of a finned internal thermal device depicting the enhancement of micro-grooves.

As shown in FIG. 6, another unexpected improvement over previous thermal conduction modules results from the modification of the face 25 of the finned internal thermal device in contact with the surface of chip 11 wherein grooves 28 may be incorporated in the face. The grooves may have a various array of geometric patterns and are preferably in the range of 15 to 200 microns wide and deep. The thermal resistance is improved when grooves are incorporated into the system described above as the working examples which follow will clearly demonstrate.

Figure 7:
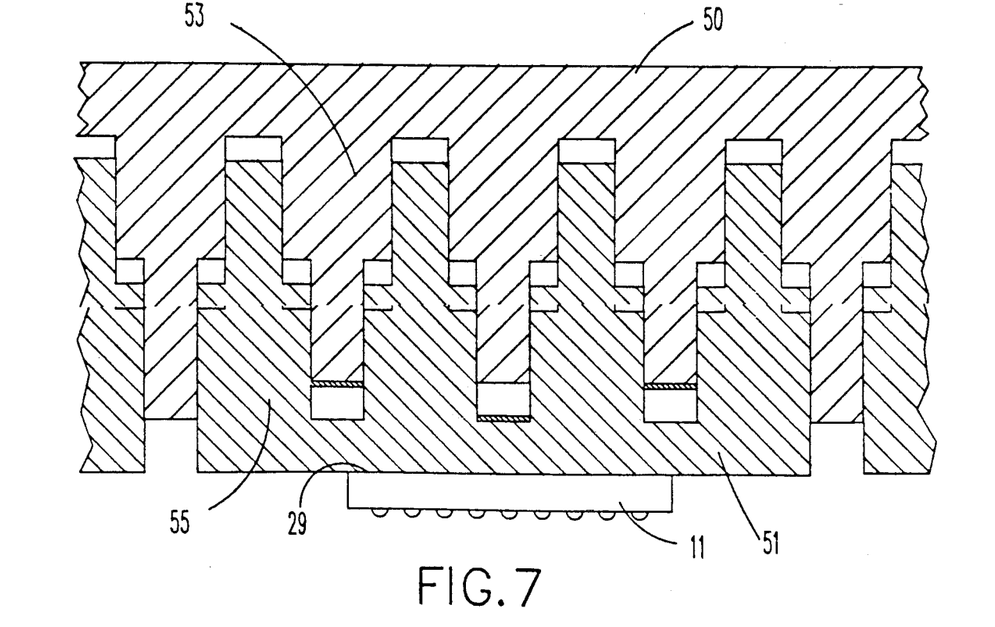
FIG. 7 shows a fragmentary sectional view of a portion of the enhanced high conduction cooling module of the present invention having stepped fins.

Referring to FIG. 7, the fins of the finned internal thermal device and the corresponding fins of the cooling hat may be stepped to improve thermal performance by providing a shape which more closely follows the heat flux lines. Rigid stepped fins 55 on rigid base 51 are intermeshed with the stepped fins 53 of modified cooling hat 50.

Other variations on the basic structure of this invention wherein the fins are tapered in a negative or positive pitch are also available.

WORKING EXAMPLES

Figure 3E:
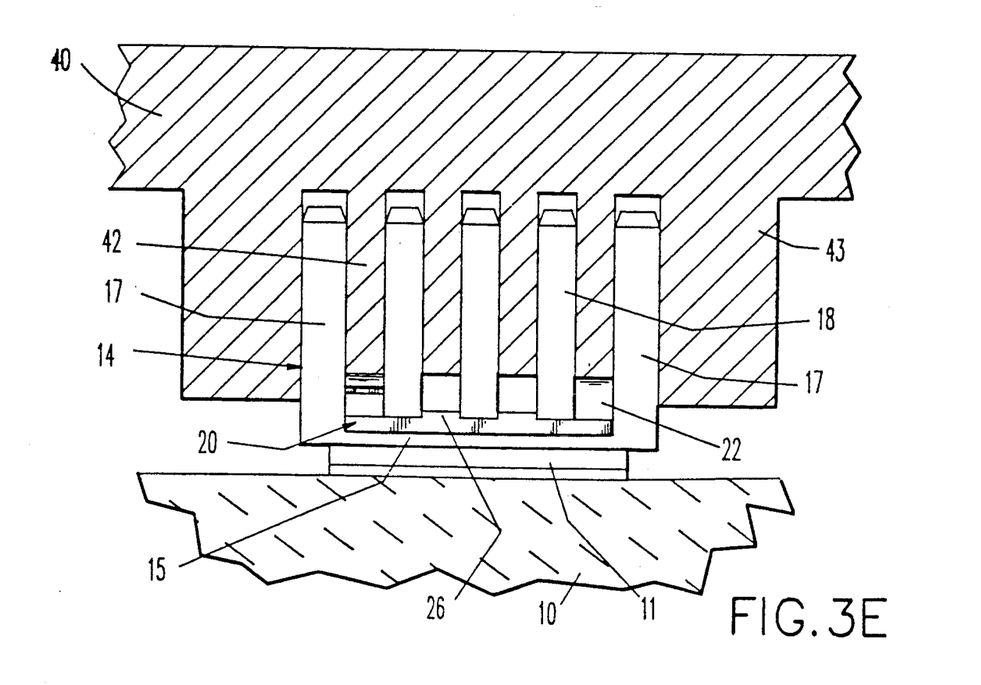
FIG. 3E shows a fragmentary sectional view of a portion of the enhanced high conduction cooling module assembly having an alternate number of fins.

The dimensions of the critical components of the present invention are determined by the size and power dissipation of the chips to be cooled. For example, in order to dissipate heat from a 30 watt chip of chip size 6.5×6.5 mm. square in a system wherein poly(alfaolefin) oil is used as the compliant thermal medium 29 and wherein the finned internal thermal device 14 is made of copper, the preferred dimensions are as follows:

Referring to FIG. 3E, there are preferably five rigid fins of the finned internal thermal device in the application having oil as the compliant thermal medium and the rigid base 15 is preferably approximately 9.1 mm. square and approximately 1.3 mm thick. The width of outermost rigid fins 17 are approximately 1.3 mm., while the width of the interior fins 18 are approximately 0.8 mm. The vertical height of each fin from the top of the rigid base 15 is approximately 5.8 mm. The width of the outermost fins 43 of cooling hat 40 are approximately 1.7 mm., while the width of the interior fins 42 are approximately 0.8 mm; and the length of fins 43 is approximately 7.1 mm, and the length of fins 42 is approximately 5.8 mm. The width of the oil filled gap between corresponding fins is approximately 0.035 mm., and the overlapping length of corresponding fins is approximately 4.8 mm.

A double cantilever zirconium-copper spring having an angle of approximately 25 degrees between the horizontal and each cantilever was used. To accommodate manufacturing tolerances of the overall module, there is approximately a 0.8 mm. space between the top of the rigid fins 17, 18 and the corresponding opening in cooling hat 40; and a 0.8 mm. space between the bottom of the fins 42 and the corresponding top of the base 15.

For the above described structure, the total thermal resistance is approximately 1.1°–1.2° C. per Watt. This thermal resistance measured between the chip and the top of the cooling hat provided for the required dissipation of approximately 30 watts per 6.5 mm. square chip in a high conduction cooling system wherein the water or other thermally conductive fluid cannot be directly incorporated into the chip compartment. Chip tilt and height variations are easily accommodated, and the finned internal thermal device is free to slide parallel to the surface of the chip and tilt with the chip in both directions. The double cantilever spring retained the finned internal thermal device against the chip surface with at least 120 grams of force, but less than approximately 400 grams of force to prevent damage to the solder ball joints or chip circuitry. In addition, the temperature over the surface of the chip was uniform and maintained within acceptable limits. No debris was found at the interface, as all was embedded into the soft metal face 25 of the finned internal thermal device.

In applications calling for thermal paste as the compliant thermal interface 29 between corresponding intermeshed fins, it is preferred that the fins 17, 18 of the finned internal thermal device 14 and the corresponding fins 42, 43 of cooling hat 40 are shortened in length by approximately 1.8 mm. each increased in width by approximately 0.25 mm. each and the number of fins be decreased from five fins to four. The thermal resistance from the circuits of the chip to the top of the cooling hat is approximately 0.7°–0.75° C./W for a 6.5 mm. square chip.

Referring to FIG. 5A, the incorporation of the side biasing means into the finned internal thermal device described above results in an improvement of the overall thermal resistance. The incorporation of such side biasing means is typically applicable in applications wherein low viscosity fluids are used as the compliant thermal medium. The dimensions of the embodiment using side-biasing are comparable to those utilized in the prior example having thermal paste. In the side-biasing embodiment, a spring flap 61 of approximately 0.1 mm. is formed by cutting the outermost surface of the outermost rigid fin of the finned internal thermal device. An additional enhancement may be made to the side-biasing means by depositing a layer of solder approximately 0.05 mm. thick on each fin of the finned internal thermal device. The solder is reflowed after assembly. In this embodiment, the fins 42, 43 of cooling hat 40 must be non-wettable to solder. The thermal resistance of this system from the circuits of the chip to the top of the cooling hat is approximately 0.7°–0.75° C./W for a 6.5 mm. square chip.

Referring to FIG. 6, the incorporation of grooves 28 into the surface 25 of the base of the finned internal thermal device is shown. The grooves have been found to further reduce the thermal resistance by approximately 10% over the high conduction cooling module systems described above. The grooves may be between 15 and 200 microns wide and deep, but are preferably 15–50 microns wide and 15–20 microns deep, and spaced approximately 0.25 mm. apart. The grooves provide an escape path for excess oil or other compliant medium and particulate contamination.

In sum, the combination of the finned internal thermal device and corresponding finned cooling hat with a compliant thermal medium between the chip surface and oppositely facing base of the finned internal thermal device and the unique biasing means providing a balanced load between each finned internal thermal device and the fins of the cooling hat that urges the flat base of the finned internal thermal device towards the chips through the compliant thermal medium provides a low thermal resistance capable of cooling chips of high power dissipation in a high conduction cooling module type system while accommodating chip tilt and height variations. This is accomplished without rigid interfaces that would damage the chip circuitry or chip solder ball connection means and without permanent connections that would make the rework of chips in such a high conduction cooling module most difficult, if not impossible. A combination of elements also facilitates the simple incorporation of other features that unexpectedly have been found to substantially lower the thermal resistance by an even greater amount such as side biasing means and grooves in the face of the base of the finned internal thermal device.

Thus, there has been provided in accordance with the present invention an improved high conduction cooling module for cooling a chip or plurality of chips that satisfies the objects of the present invention.

While the invention has been described in conjunction with specific embodiments, it is evident that many alternatives or modifications of the elements of the present invention will be apparent to those skilled in the art in light of the teachings of the present invention.

It is therefore to be understood by those skilled in the art that the foregoing and other alternatives and modifications in form or detail fall within the true scope and spirit of the present invention.

What is claimed is:

1. An apparatus for removing heat from a heat generating device comprising:
   at least one heat conductive finned internal thermal device comprising, a base having a plurality of first substantially rigid fins on a first surface and a second surface which is flat and directly facing said heat generating device;
   a heat conductive cooling hat having a plurality of second substantially rigid fins facing toward said heat generating device;
   said first fins being interspersed with and at least partially overlapping said second fins so that at least one gap exists between overlapping portion of adjacent fins, and first and second channels exist, and wherein said second fins all have uniform thickness for that portions that corresponds with said first fins;
   each first channel being partially bound by adjacent first fins and each second channel being partially bound by adjacent second fins;
   biasing means located at least in one of said channel or secured at least to a surface of at least one of said first fins, and exerting a biasing force between said cooling hat and at least one heat conductive finned internal thermal device, thereby urging said second surface of said base toward said heat generating device.

2. The apparatus of claim 1 wherein said biasing means is a spring comprised of at least one arm.

3. The apparatus of claim 2 wherein said spring is capable of being compressed to approximately one to three times the thickness of said at least one arm when mounted between said finned internal thermal device and said finned cooling hat.

4. The apparatus of claim 1 wherein said biasing means is a cantilever type spring having at least one cantilever arm.

5. The apparatus of claim 2 wherein said biasing means is a cantilever type spring having at least one cantilever arm.

6. The apparatus of claim 1 wherein said base and said first fins of said finned internal thermal device and said second fins of said finned cooling hat are rigid.

7. The apparatus of claim 1 wherein said heat generating device is a semiconductor chip.

8. The apparatus of claim 1 wherein said base of at least one of said finned internal thermal device overhangs said heat generating device.

9. The apparatus of claim 7 wherein said base of at least one of said finned internal thermal device overhangs said chip.

10. The apparatus of claim 9 wherein said base overhangs said heat generating device by approximately one base thickness on each side.

11. The apparatus of claim 1 wherein at least one fin of said finned internal thermal device is thicker than the other fins of said finned internal thermal device.

12. The apparatus of claim 1 wherein the ratio of the length of each fin to the width of each fin is at least approximately 3 to 1.

13. The apparatus of claim 1 wherein the ratio of the length of each fin to the width of each fin is less than approximately 10:1.

14. The apparatus of claim 1 wherein at least one peripheral second fin of said finned cooling hat that is adjacent to first peripheral fins of said finned internal thermal device is thicker than the other second fins.

15. The apparatus of claim 4 wherein each said cantilever arm has a free end which contacts the bottommost surface of a corresponding said second fin of said finned cooling hat.

16. The apparatus of claim 5 wherein each said cantilever arm has a free end which contacts the bottommost surface of a corresponding said second fin of said finned cooling hat.

17. The apparatus of claim 1 wherein said biasing means is secured to said base of said finned internal thermal device.

18. The apparatus of claim 4 wherein said cantilever type spring is secured to said base of said finned internal thermal device.

19. The apparatus of claim 1 wherein said biasing means is secured to said finned cooling hat.

20. The apparatus of claim 2 wherein said biasing means is secured to said finned cooling hat.

21. The apparatus of claim 20 wherein the free end of each said biasing means contacts the uppermost surface of a corresponding said first fin of said finned internal thermal device.

22. The apparatus of claim 15 wherein each said cantilever arm is secured to said base of said finned internal thermal device.

23. The apparatus of claim 4 wherein there are two cantilever arms.

24. The apparatus of claim 5 wherein there are two cantilever arms.

25. The apparatus of claim 24 wherein each said cantilever type spring is secured to said finned cooling hat.

26. The apparatus of claim 25 wherein the free end of each said cantilever arm contacts the uppermost surface of a corresponding said first fin of said finned internal thermal device.

27. The apparatus of claim 1 wherein a compliant thermally conductive material exists in each said at least one gap between adjacent fins.

28. The apparatus of claim 27 wherein said compliant thermally conductive material is a thermal paste or gel.

29. The apparatus of claim 27 wherein said compliant thermally conductive material is an oil-like material having a viscosity in the range of approximately 350 to 1800 centipoise.

30. The apparatus of claim 29 wherein said compliant thermally conductive material is poly(alfaolefin).

31. The apparatus of claim 1 wherein said at least one gap between adjacent fins is at least equal to the product of the corresponding chip tilt angle and the overlapping length between adjacent fins.

32. The apparatus of claim 4 wherein said cantilever type springs are interconnected.

33. The apparatus of claim 1 further comprising side biasing means urging one side of said first fins of said finned internal thermal device toward corresponding second fins of said finned cooling hat.

34. The apparatus of claim 33 wherein said side biasing means is a spring that exerts a force between a peripheral first fin of said finned internal thermal device and a corresponding second fin of said finned cooling hat.

35. The apparatus of claim 34 wherein said spring member is a flap that is an integral portion of at least one peripheral first fin of said finned internal thermal device.

36. The apparatus of claim 34 wherein said spring member is a flap that is an integral portion of at least one second fin of said finned cooling hat corresponding to at least one peripheral first fin of said finned internal thermal device.

37. The apparatus of claim 34 wherein said side biasing means is a resilient sheet having bowed portions therein.

38. The apparatus of claim 1 wherein there is at least one groove in said second surface of said finned internal thermal device.

39. The apparatus of claim 38 wherein said grooves are between approximately 15 and 200 microns wide.

40. The apparatus of claim 1 wherein said first fins of said finned internal thermal device and said second fins of said finned cooling hat are stepped fins.

41. The apparatus of claim 1 wherein said first fins of said finned internal thermal device and said second fins of said finned cooling hat are tapered fins.

42. The apparatus of claim 1 wherein a compliant thermally conductive medium exists between said heat generating device and said second surface of said base.

43. The apparatus of claim 42 wherein said compliant thermally conductive material is a thermal paste or gel.

44. The apparatus of claim 42 wherein said compliant thermally conductive material is an oil-like material having a viscosity in the range of approximately 350 to 1800 centipoise.

45. The apparatus of claim 42 wherein said compliant thermally conductive material is poly(alfaolefin).

* * * * *